United States Patent
Voss et al.

(10) Patent No.: US 12,046,509 B2
(45) Date of Patent: Jul. 23, 2024

(54) SEMICONDUCTOR DEVICE PROTECTION USING AN ANTI-REFLECTIVE LAYER

(71) Applicant: Infineon Technologies AG, Neubiberg (DE)

(72) Inventors: Stephan Voss, Munich (DE); Alexander Breymesser, Villach (AT); Eva-Maria Hof, Villach (AT); Mathias Plappert, Drobollach (AT); Carsten Schaeffer, Annenheim (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 332 days.

(21) Appl. No.: 17/128,866

(22) Filed: Dec. 21, 2020

(65) Prior Publication Data

US 2022/0199464 A1 Jun. 23, 2022

(51) Int. Cl.
*H01L 21/768* (2006.01)
*H01L 23/00* (2006.01)
*H01L 23/52* (2006.01)

(52) U.S. Cl.
CPC ........ *H01L 21/76838* (2013.01); *H01L 23/52* (2013.01); *H01L 23/564* (2013.01)

(58) Field of Classification Search
CPC . H01L 21/76838; H01L 23/52; H01L 23/564; H01L 23/3157
See application file for complete search history.

(56) References Cited

U.S. PATENT DOCUMENTS

| | | | | |
|---|---|---|---|---|
| 5,712,206 A | * | 1/1998 | Chen | H01L 23/5258 257/E23.15 |
| 6,677,226 B1 | * | 1/2004 | Bowen | H01L 23/53228 257/E23.15 |
| 2004/0058531 A1 | * | 3/2004 | Hsieh | H01L 21/76805 257/E21.582 |
| 2004/0171239 A1 | * | 9/2004 | Tanaka | H01L 28/40 257/E21.582 |
| 2012/0091594 A1 | * | 4/2012 | Landesberger | H01L 24/19 257/E23.068 |
| 2014/0291695 A1 | | 10/2014 | Schulze et al. | |
| 2015/0262814 A1 | * | 9/2015 | Plappert | H01L 23/3171 257/632 |
| 2018/0233353 A1 | * | 8/2018 | Felix | H01L 21/321 |
| 2019/0385964 A1 | * | 12/2019 | Choi | H01L 25/0657 |
| 2020/0203443 A1 | * | 6/2020 | Zhao | H10K 71/00 |

(Continued)

FOREIGN PATENT DOCUMENTS

KR 20090035234 A * 4/2009 ............. G03F 7/095

OTHER PUBLICATIONS https://www.ormocere.de/en.html; Fraunhofer-Institut für Silicatforschung ISC, 2023; one page. (Year: 2023).*

(Continued)

*Primary Examiner* — John P. Dulka
(74) *Attorney, Agent, or Firm* — Cooper Legal Group LLC

(57) ABSTRACT

A semiconductor device and a method of manufacturing a semiconductor are provided. In an embodiment, a metallic layer may be formed over a semiconductor substrate. An anti-reflective layer may be formed over the metallic layer. A passivation layer may be formed over the anti-reflective layer. An opening may be formed in the passivation layer to expose the anti-reflective layer.

24 Claims, 10 Drawing Sheets

(56) References Cited

U.S. PATENT DOCUMENTS

2020/0411445 A1* 12/2020 Chen .................. H01L 21/4857
2021/0287981 A1* 9/2021 Shih ....................... H01L 23/28

OTHER PUBLICATIONS https://globalsilicones.org/explore-silicones/what-are-silicones/; Global Silicones Council; 2023, one page (Year: 2023).*
H. R. Philipp, H. S. Cole, Y. S. Liu, and T. A. Sitnik, "Optical absorption of some polymers in the region 240-170 nm", Appl. Phys. Lett. 48, 192-194 (1986) https://doi.org/10.1063/1.96940 (Year: 1986).*

* cited by examiner

SEMICONDUCTOR DEVICE PROTECTION USING AN ANTI-REFLECTIVE LAYER

TECHNICAL FIELD

The present disclosure relates to semiconductor devices.

BACKGROUND

A semiconductor device, such as a transistor, a thyristor, etc., may be used in humid environments. If the semiconductor device is not sufficiently protected, liquid and/or vapor may enter the semiconductor device and/or cause damage to one or more components of the semiconductor device.

SUMMARY

This Summary is provided to introduce a selection of concepts in a simplified form that are further described below in the Detailed Description. This Summary is not intended to identify key factors or essential features of the claimed subject matter, nor is it intended to be used to limit the scope of the claimed subject matter.

In an embodiment, a method of manufacturing a semiconductor device is provided. A metallic layer may be formed over a semiconductor substrate. An anti-reflective layer may be formed over the metallic layer. A passivation layer may be formed over the anti-reflective layer. An opening may be formed in the passivation layer to expose the anti-reflective layer.

In an embodiment, a semiconductor device is provided. The semiconductor device may comprise a metallic layer overlying a semiconductor substrate. The semiconductor device may comprise an anti-reflective layer overlying the metallic layer. The semiconductor device may comprise a passivation layer overlying the anti-reflective layer. The semiconductor device may comprise a conductive structure extending through the passivation layer.

In an embodiment, a semiconductor device is provided. The semiconductor device may comprise a metallic layer overlying a semiconductor substrate. The semiconductor device may comprise an anti-reflective layer overlying the metallic layer. The semiconductor device may comprise a passivation layer overlying the anti-reflective layer. An opening in the passivation layer may expose the anti-reflective layer and/or the metallic layer.

To the accomplishment of the foregoing and related ends, the following description and annexed drawings set forth certain illustrative aspects and implementations. These are indicative of but a few of the various ways in which one or more aspects may be employed. Other aspects, advantages, and novel features of the disclosure will become apparent from the following detailed description when considered in conjunction with the annexed drawings.

DESCRIPTION OF THE DRAWINGS

FIG. 10 schematically illustrates acts of manufacturing a semiconductor device according to various examples.

DETAILED DESCRIPTION

Figure 1A:
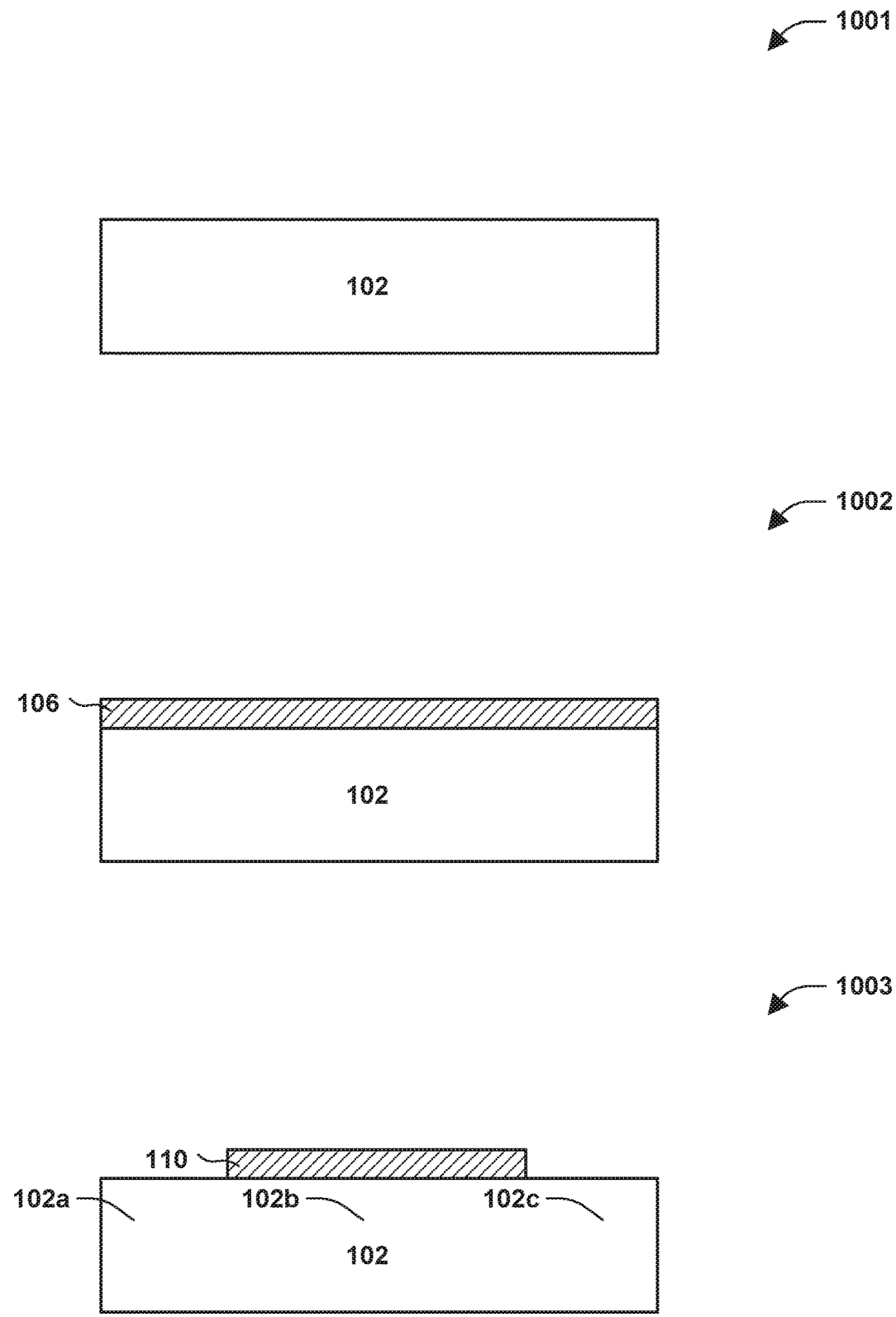
FIG. 1A schematically illustrates acts of manufacturing a semiconductor device according to various examples.
Figure 1B:
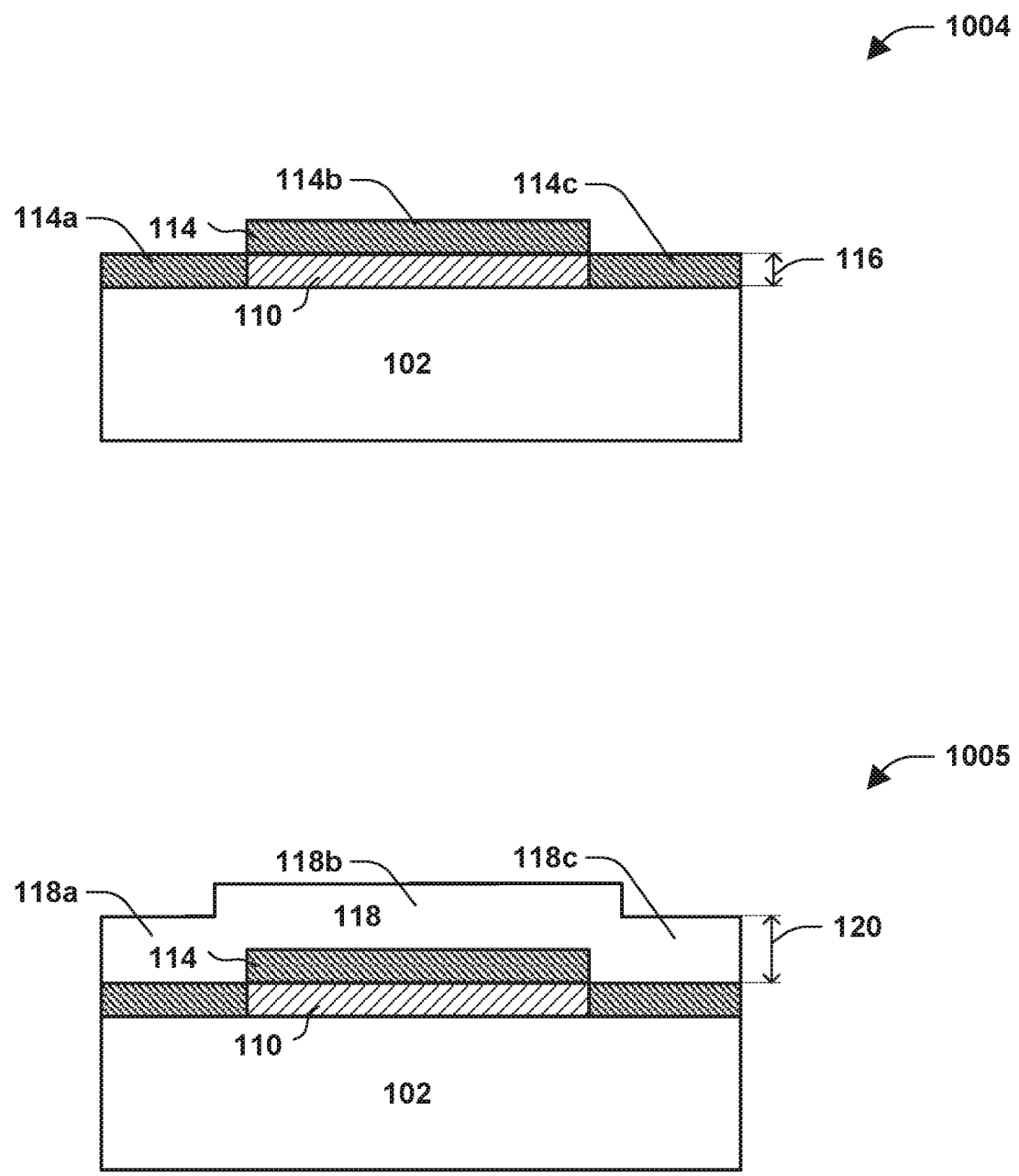
FIG. 1B schematically illustrates acts of manufacturing a semiconductor device according to various examples.
Figure 1C:
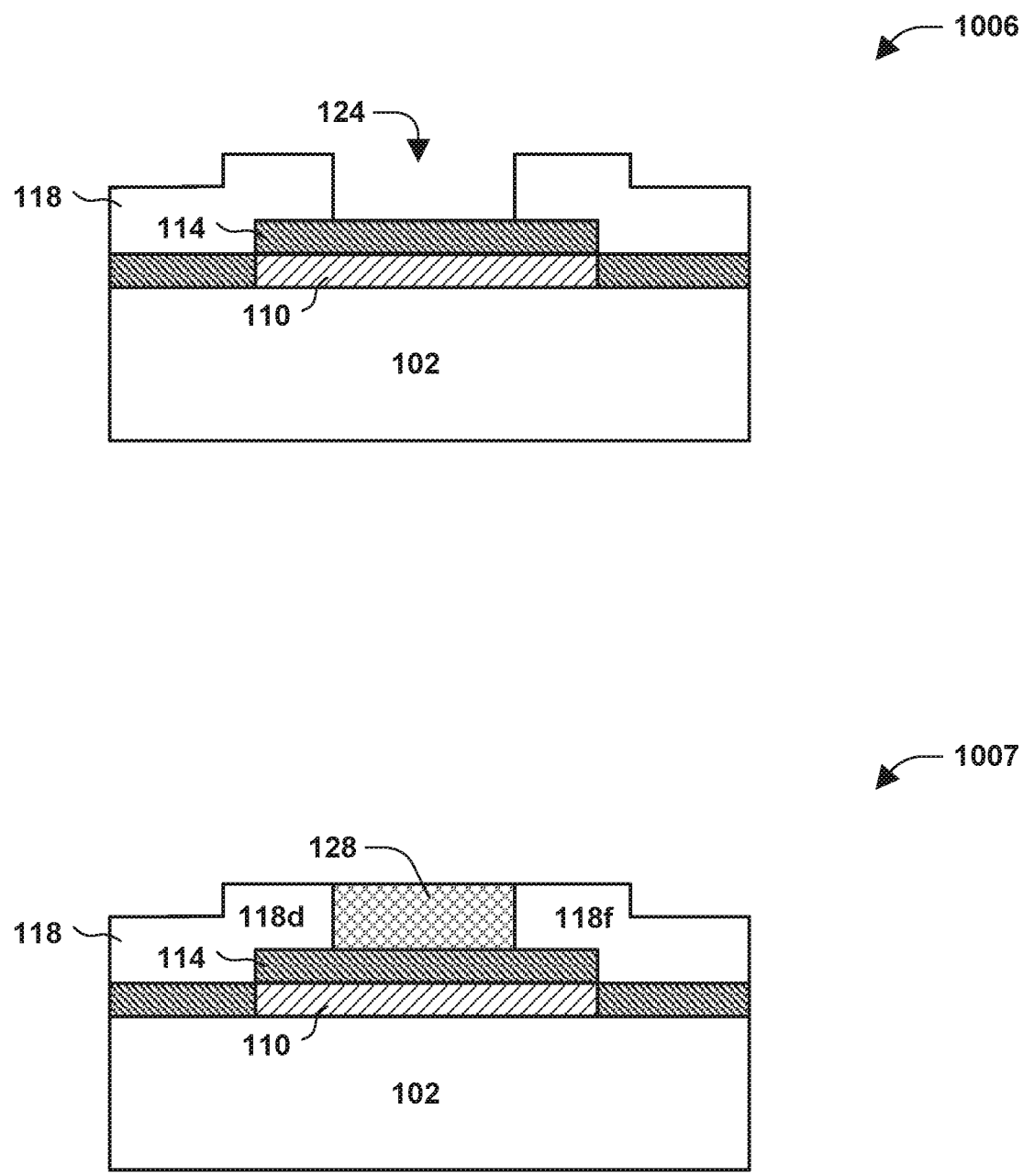
FIG. 1D schematically illustrates acts of manufacturing a semiconductor device according to various examples.
Figure 1D:
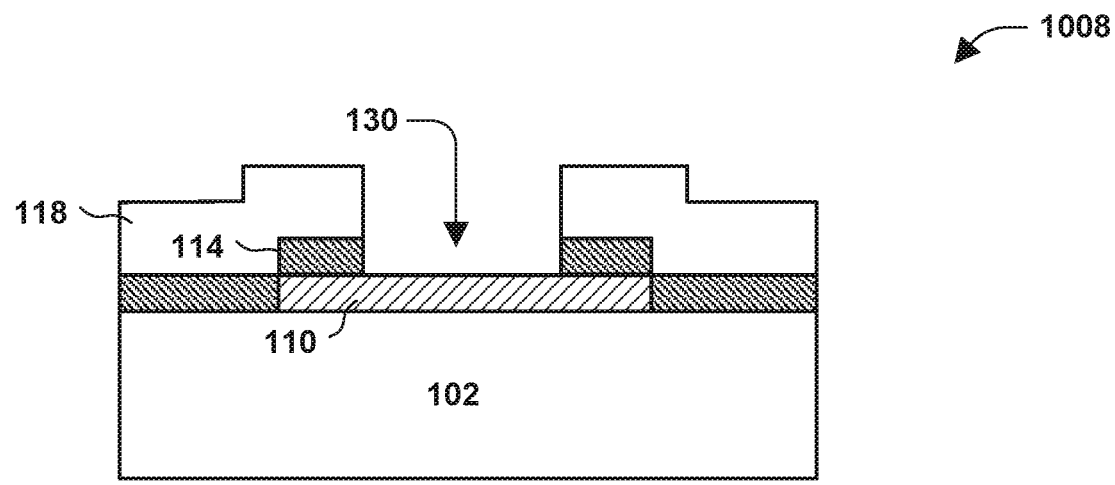
Figure 1D:
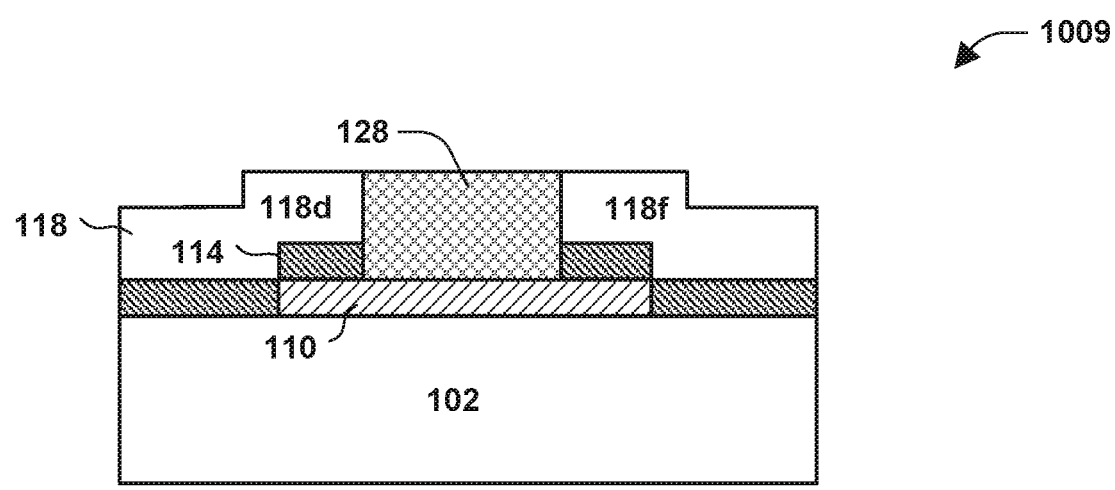

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, well-known structures and devices are shown in block diagram form in order to facilitate describing the claimed subject matter.

It is to be understood that the following description of embodiments is not to be taken in a limiting sense. The scope of the present disclosure is not intended to be limited by the embodiments described hereinafter or by the drawings, which are taken to be illustrative only. The drawings are to be regarded as being schematic representations and elements illustrated in the drawings are not necessarily shown to scale. Rather, the various elements are represented such that their function and general purpose become apparent to a person skilled in the art.

All numerical values within the detailed description and the claims herein are modified by "about" or "approximately" the indicated value, and take into account experimental error and variations that would be expected by a person having ordinary skill in the art.

The term "over" and/or "overlying" is not to be construed as meaning only "directly over" and/or "having direct contact with". Rather, if one element is "over" and/or "overlying" another element (e.g., a region is overlying another region), a further element (e.g., a further region) may be positioned between the two elements (e.g., a further region may be positioned between a first region and a second region if the first region is "over" and/or "overlying" the second region). Further, if a first element is "over" and/or "overlying" a second element, at least some of the first element may be vertically coincident with the second element, such that a vertical line may intersect the first element and the second element.

The semiconductor substrate or body may extend along a main extension plane. The term "horizontal" as used in this specification intends to describe an orientation substantially parallel to said main extension plane. A first or main horizontal side of the semiconductor substrate or body may run substantially parallel to horizontal directions or may have surface sections that enclose an angle of at most 8° (or at most 6°) with the main extension plane. The first or main horizontal side can be for instance the surface of a wafer or a die. Sometimes, the horizontal direction is also referred to as lateral direction.

The term "vertical" as used in this specification intends to describe an orientation which is substantially arranged perpendicular to the horizontal direction, (e.g., parallel to the normal direction of the first side of the semiconductor substrate or body or parallel to the normal direction of a surface section of the first side of the semiconductor substrate or body).

A semiconductor device is provided. The semiconductor device may be used and/or stored in an environment with humidity and/or other contamination (e.g., ionic contamination). The humidity and/or the other contamination contacting one or more portions of the semiconductor device may cause damage to one or more components of the semiconductor device. Accordingly, at least some of the semiconductor device may be layered with a protective layer to prevent liquid, vapor and/or other contamination from entering and/or contacting one or more portions of the semiconductor device. In some scenarios, the protective layer may comprise materials, such as a polyimide (e.g., photo imide), that have high levels of moisture absorption (e.g., a water uptake level of at least 1.5%). However, due to the high levels of moisture absorption of the protective layer, the protective layer may contain at least a threshold amount of water, which may cause damage to one or more components of the semiconductor device.

In accordance with the present disclosure, a semiconductor device and a method of manufacturing the semiconductor device are provided. The semiconductor device may comprise a passivation layer acting as a protective layer to protect the semiconductor device from liquid, vapor and/or other contamination (e.g., ionic contamination). The passivation layer may comprise a spin-coatable material (e.g., spin-coatable silicon) and/or a photopatternable material, such as a photopatternable inorganic-organic hybrid material (e.g., a photopatternable silicon material, a photopatternable organic modified ceramic material, etc.). The passivation layer may have a low level of moisture absorption (e.g., a water uptake level of at most 0.3% and/or at most 0.1%), and thus provide for improved protection of the semiconductor device from liquid, vapor and/or other contamination. The semiconductor device may comprise an anti-reflective layer. The anti-reflective layer may be formed prior to forming the passivation layer. The anti-reflective layer may improve structuring of the passivation layer, such as by providing for an increase in resolution with which the passivation layer may be structured (e.g., structured via photolithography) and/or by providing for a longer process window during which one or more processing acts associated with structuring the passivation layer can be performed.

In an embodiment of the presently disclosed embodiments, a method of manufacturing a semiconductor device is provided. The semiconductor device may comprise a two-terminal device (e.g., a diode), a three-terminal device (e.g., a transistor and/or a thyristor) and/or a device with more than three terminals. In some examples, the semiconductor device is a power semiconductor device, such as a semiconductor device with a voltage blocking capability of at least a threshold (e.g., 30 volts (V), 600 V, 3.3 kilovolts (kV), and/or a different threshold) and/or with an on-state current and/or forward current of at least a threshold (e.g., 1 ampere (A), 10 A, and/or a different threshold). In some examples, the semiconductor substrate may comprise an insulated-gate bipolar transistor (IGBT), a field-effect transistor (FET), a metal-oxide-semiconductor FET (MOSFET), a metal-insulator-semiconductor FET (MISFET), a metal-semiconductor FET (MESFET), an insulated-gate FET (IGFET), a high-electron mobility transistor (HEMT), a heterostructure FET (HFET) and/or a modulation-doped FET (MODFET). Alternatively and/or additionally, the semiconductor device may comprise a type of transistor not listed herein.

The method may comprise forming a first metallic layer over a semiconductor substrate. In some examples, forming the first metallic layer comprises forming a structured metallic layer. For example, a second metallic layer may be formed over the semiconductor substrate, and the second metallic layer may be structured to form the first metallic layer. For example, one or more portions of the second metallic layer may be removed to form the first metallic layer.

The method may comprise forming an anti-reflective layer over the first metallic layer. In some examples, the anti-reflective layer comprises an amorphous silicon material.

In some examples, forming the first metallic layer comprises forming an unstructured metallic layer. In some examples, after forming the anti-reflective layer and before forming a passivation layer, the anti-reflective layer and the unstructured metallic layer (e.g., the first metallic layer) are structured. For example, the anti-reflective layer and the unstructured metallic layer may be structured by removing one or more portions of the anti-reflective layer and one or more portions of the unstructured metallic layer.

The method may comprise forming a passivation layer over the anti-reflective layer. In some examples, the passivation layer comprises a photopatternable inorganic-organic hybrid material. In some examples, the photopatternable inorganic-organic hybrid material comprises a photopatternable silicon material. In some examples, the photopatternable inorganic-organic hybrid material comprises a photopatternable organic modified ceramic material (e.g., ORMOCER® material). In some examples, the passivation layer comprises spin-coatable material. In some examples, the spin-coatable material comprises spin-coatable silicon (e.g., spin-on silicon). In some examples, the spin-coatable material is photopatternable.

In some examples, forming the passivation layer comprises performing a spin-coating process (e.g., a spin-coating process to deposit spin-coatable material over the anti-reflective layer).

The method may comprise forming an opening in the passivation layer. The opening may expose the anti-reflective layer without exposing the metallic layer. Alternatively and/or additionally, the opening may expose the anti-reflective layer and/or the metallic layer. The method may comprise forming a conductive structure in the opening. In some examples, the conductive structure may be electrically coupled to one or more components of the semiconductor device and/or the conductive structure may be electrically coupled to external circuitry (e.g., a power source, a load of the semiconductor device, ground, a controller, etc.).

In an embodiment of the presently disclosed embodiments, a semiconductor device is provided. The semiconductor device may comprise a metallic layer overlying a semiconductor substrate. The metallic layer may be a structured metallic layer. The semiconductor device may comprise an anti-reflective layer overlying the metallic layer. The anti-reflective layer may be a structured anti-reflective layer. Alternatively and/or additionally, the anti-reflective layer may be an unstructured anti-reflective layer. The anti-reflective layer may comprise an amorphous silicon material.

The semiconductor device may comprise a passivation layer overlying the anti-reflective layer. The passivation layer may comprise a spin-coatable material. Alternatively and/or additionally, the passivation layer may comprise a photopatternable inorganic-organic hybrid material. The photopatternable inorganic-organic hybrid material may comprise a photopatternable silicon material. Alternatively and/or additionally, the photopatternable inorganic-organic hybrid material may comprise a photopatternable organic modified ceramic material.

In some examples, a first optical absorption coefficient of the passivation layer is less than a second optical absorption coefficient of a polyimide. In an example, the passivation layer may have a first optical absorption coefficient at the i-line wavelength (e.g., 365 nm wavelength) or other wavelength. A polyimide may have a second optical absorption coefficient at the i-line wavelength or the other wavelength. The first optical absorption may be less than the second optical absorption.

The semiconductor device may comprise a conductive structure extending through the passivation layer. The conductive structure may be electrically coupled to the metallic layer.

Alternatively and/or additionally, the passivation layer may have an opening. The opening may extend through the passivation layer. The opening may expose the anti-reflective layer.

Alternatively and/or additionally, the opening may extend through the passivation layer and the anti-reflective layer. The opening may expose the anti-reflective layer and/or the metallic layer.

FIGS. 1A-1D illustrate aspects with respect to manufacturing a semiconductor device according to various examples of the present disclosure. At 1001 (illustrated in FIG. 1A), a semiconductor substrate 102 is provided. The semiconductor substrate 102 may comprise crystalline semiconductor material. The semiconductor substrate 102 may comprise a semiconductor element (e.g., silicon, germanium, and/or other semiconductor element) and/or a semiconductor compound (e.g., silicon carbide (SiC), silicon germanium (SiGe), gallium arsenide (GaAs), gallium nitride (GaN) and/or other semiconductor compound). The semiconductor substrate 102 may comprise dopants (e.g., nitrogen (N), phosphorus (P), beryllium (Be), boron (B), aluminum (Al), gallium (Ga) and/or other dopants). Alternatively and/or additionally, the semiconductor substrate 102 may comprise impurities (e.g., hydrogen, fluorine, oxygen and/or other impurities).

At 1002 (illustrated in FIG. 1A), a metallic layer 106 is formed over the semiconductor substrate 102. The metallic layer 106 may be an unstructured metallic layer. The metallic layer 106 may comprise one or more metals (e.g., titanium (Ti), Nickel (Ni), Molybdenum (Mo), and/or other metal). The metallic layer 106 may overlie the semiconductor substrate 102. Alternatively and/or additionally, the metallic layer 106 may be vertically coincident with the semiconductor substrate 102. In some examples, a surface of the metallic layer 106 may be adjacent to a first side (e.g., a top side) of the semiconductor substrate 102. The metallic layer 106 may cover (e.g., completely cover or partially cover) the first side of the semiconductor substrate 102. The metallic layer 106 may be in contact (e.g., direct contact) with the first side of the semiconductor substrate 102. Alternatively and/or additionally, the metallic layer 106 may not be in contact (e.g., direct contact) with the first side of the semiconductor substrate 102 (e.g., one or more layers may be disposed between the metallic layer 106 and the semiconductor substrate 102). In some examples, the metallic layer 106 may be a part of an edge termination structure (not shown) of the semiconductor device. Alternatively and/or additionally, the metallic layer 106 may overlie and/or be in contact with the edge termination structure.

At 1003 (illustrated in FIG. 1A), a structured metallic layer 110 is formed from the metallic layer 106. In some examples, the metallic layer 106 is structured to form the structured metallic layer 110. For example, one or more portions of the metallic layer 106 may be removed to form the structured metallic layer 110. The one or more portions of the metallic layer 106 may be removed via etching (e.g., electrochemical etching, plasma etching, wet etching and/or one or more other types of etching) and/or via one or more other removal techniques. In some examples, the structured metallic layer 110 may cover merely a portion of the first side of the semiconductor substrate 102. In some examples, the structured metallic layer 110 may comprise one or more metallic structures. A metallic structure of the structured metallic layer 110 may be vertically coincident with a portion 102b of the semiconductor substrate 102, and/or may not be vertically coincident with portions 102a and 102c of the semiconductor substrate 102.

At 1004 (illustrated in FIG. 1B), an anti-reflective layer 114 is formed over the structured metallic layer 110 and/or the semiconductor substrate 102. The anti-reflective layer 114 may be an unstructured anti-reflective layer. The anti-reflective layer 114 may overlie the structured metallic layer 110 and/or the semiconductor substrate 102. Alternatively and/or additionally, the anti-reflective layer 114 may be vertically coincident with the semiconductor substrate 102. In some examples, a portion 114b of the anti-reflective layer 114 may be vertically coincident with the structured metallic layer 110. Portions 114a and 114c of the anti-reflective layer 114 may not be vertically coincident with the structured metallic layer 110. The portions 114a and 114c of the anti-reflective layer 114 may be horizontally coincident with the structured metallic layer 110.

The anti-reflective layer 114 may comprise an amorphous silicon material, a dielectric material, a metal, a metal oxide and/or one or more other materials. A thickness 116 of the anti-reflective layer 114 may be in the range of at least 5 nanometers (nm) to at most 300 nm, in the range of at least 5 nm to at most 100 nm, and/or in the range of at least 5 nm to at most 20 nm. In some examples, the anti-reflective layer 114 comprises a single layer. Alternatively and/or additionally, the anti-reflective layer 114 may comprise multiple layers.

In some examples, the anti-reflective layer 114 may be configured to mitigate and/or inhibit reflection. For example, the amorphous silicon material and/or one or more other materials of the anti-reflective layer 114 may suppress light reflection. Alternatively and/or additionally, the anti-reflective layer 114 may be configured to provide improved adhesion with a subsequently formed layer (e.g., a passivation layer 118) overlying the anti-reflective layer 114. In an example in which the anti-reflective layer 114 comprises multiple layers, an outer layer of the multiple layers may be configured to provide improved adhesion with the subsequently formed layer. Alternatively and/or additionally, the anti-reflective layer 114 may be configured to provide one or more functionalities for the semiconductor device and/or the edge termination structure, such as high-ohmic charge shielding. For example, the anti-reflective layer 114 may comprise a material (e.g., the amorphous silicon material and/or one or more other materials), having a conductivity lower than a threshold to mitigate and/or inhibit electrical conduction through the anti-reflective layer 114, to prevent an electrical short-circuit between components of (and/or connected to) the semiconductor device and/or the edge termination structure, and/or to avoid impacting one or more functions of the semiconductor device and/or the edge termination structure).

In some examples, one or more portions of the anti-reflective layer 114 may be removed to inhibit electrical coupling and/or electrical conductivity between one or more components of the semiconductor device. For example, a portion of the anti-reflective layer 114 between metallic structures (e.g., two metallic structures of the structured metallic layer 110) may be removed to inhibit electrical coupling and/or electrical conductivity between the metallic structures.

In some examples, the anti-reflective layer 114 may be structured to form a structured anti-reflective layer. For example, the anti-reflective layer 114 may be structured by removing one or more portions of the anti-reflective layer 114 that overlie and/or are in contact with a surface and/or material having a reflectivity that is less than a threshold reflectivity. In some examples, the structured metallic layer 110 (and/or a top surface of the structured metallic layer 110) may have a reflectivity exceeding the threshold reflectivity. Accordingly, the structured anti-reflective layer may comprise one or more portions overlying one or more metallic structures of the structured metallic layer 110. For example, a portion of the anti-reflective layer 114 that is vertically coincident with a metallic structure of the structured metallic layer 110 may not be removed to form the structured anti-reflective layer 114. In some examples, the semiconductor substrate 102 (and/or a top surface of the semiconductor substrate 102) may have a reflectivity less than the threshold reflectivity. Accordingly, a portion of the anti-reflective layer 114 that is not vertically coincident with a metallic structure of the structured metallic layer 110 (and/or that is vertically coincident with and/or in contact with the semiconductor substrate 102) may be removed to form the structured anti-reflective layer 114.

At 1005 (illustrated in FIG. 1B), a passivation layer 118 is formed over the anti-reflective layer 114, the structured metallic layer 110 and/or the semiconductor substrate 102. The passivation layer 118 may overlie the anti-reflective layer 114, the structured metallic layer 110 and/or the semiconductor substrate 102. Alternatively and/or additionally, the passivation layer 118 may be vertically coincident with the anti-reflective layer 114 and/or the semiconductor substrate 102. In some examples, a portion 118*b* of the passivation layer 118 may be vertically coincident with a metallic structure of the structured metallic layer 110. Portions 118*a* and 118*c* of the passivation layer 118 may not be vertically coincident with a metallic structure of the structured metallic layer 110.

The passivation layer 118 may comprise a photopatternable material. A photopatternable material may be photosensitive and/or may have one or more properties that enable the photopatternable material to be structured using light (such as via photolithography). For example, one or more properties, such as solubility, of a photopatternable material can be affected by light. In an example, the passivation layer 118 may comprise a photopatternable inorganic-organic hybrid material. The photopatternable inorganic-organic hybrid material may comprise a silicon material (e.g., a photopatternable silicon material). Alternatively and/or additionally, the passivation layer 118 may comprise a photopatternable organic modified ceramic material (e.g., ORMOCER® material). The passivation layer 118 may comprise spin-coatable material. In an example where the passivation layer 118 comprises spin-coatable material, the passivation layer 118 may be formed by performing a spin-coating process to deposit the spin-coatable material over the anti-reflective layer 114. In some examples, the spin-coatable material comprises spin-coatable silicon (e.g., spin-on silicon). In some examples, the spin-coatable material is photopatternable.

A thickness 120 of the passivation layer 118 may be in the range of at least 5 micrometers (μm) to at most 100 μm, in the range of at least 10 μm to at most 50 μm, in the range of at least 10 μm to at most 30 μm, and/or in the range of at least 15 μm to at most 25 μm (such as 20 μm).

In some examples, the passivation layer 118 may be configured to mitigate and/or inhibit liquid, vapor (e.g., water and/or water vapor), and/or other contamination (e.g., ionic contamination) contacting one or more portions of the semiconductor device and/or the edge termination structure. For example, the passivation layer 118 may enable operation of the semiconductor device and/or the edge termination structure in humid environments by way of sealing (e.g., waterproofing) portions of the semiconductor device and/or the edge termination structure. The passivation layer 118 may prevent liquid and/or vapor (and/or prevent at least a threshold proportion of surrounding liquid and/or vapor) from passing through the passivation layer 118 and/or from contacting portions of the semiconductor device and/or the edge termination structure. In some examples, the passivation layer 118 has a water uptake level of at most 0.3% and/or at most 0.1%. For example, the passivation layer 118 may comprise the spin-coatable silicon, which may have a water uptake level of at most 0.3% and/or at most 0.1%.

At 1006 (illustrated in FIG. 1C), an opening 124 is formed in the passivation layer 118. The opening 124 may overlie the anti-reflective layer 114 and/or a metallic structure of the structured metallic layer 110. For example, the opening 124 may expose the anti-reflective layer 114.

In some examples, the opening 124 may be formed by photopatterning the passivation layer 118. For example, the passivation layer 118 may be exposed to a pattern of light. The pattern of light may be defined by a template, such as a mask, between a light source and the passivation layer 118. In an example (such as where the passivation layer 118 corresponds to a positive photoresist), the pattern of light may illuminate one or more portions to be removed by a developer. In an example (such as where the passivation layer 118 corresponds to a negative photoresist), the pattern of light may illuminate one or more portions not to be removed by a developer. In some examples, the passivation layer 118 may be baked in a first baking act. In an example, the first baking act may correspond to a soft bake of the passivation layer 118 and/or may be performed prior to exposing the passivation layer 118 to the pattern of light.

Figure 2:
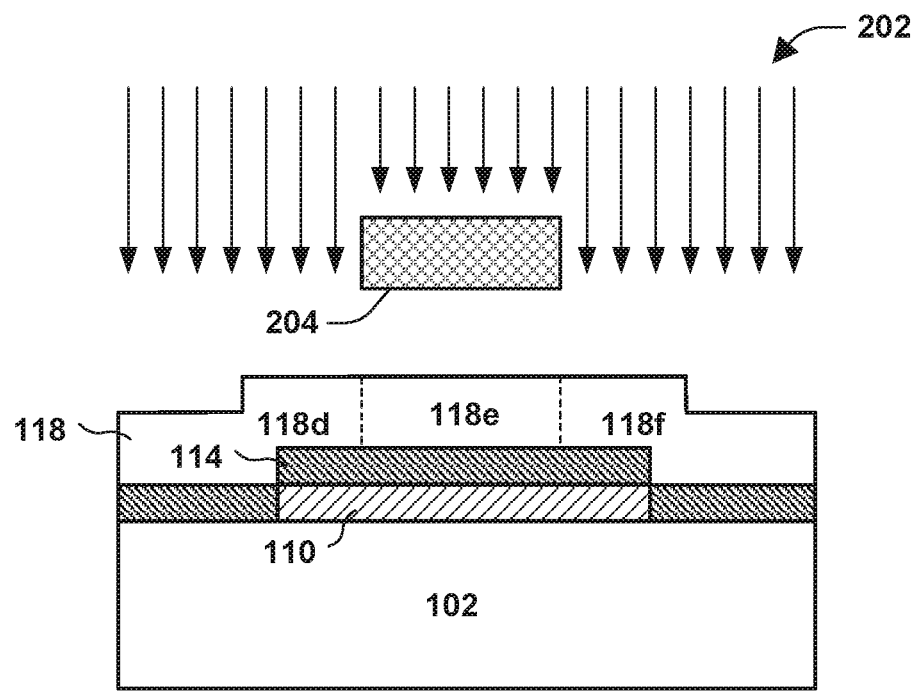
FIG. 2 schematically illustrates photopatterning a layer according to various examples.
Figure 3A:
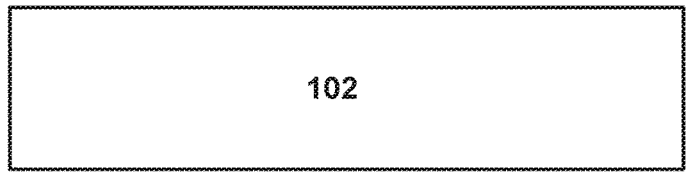
FIG. 3A schematically illustrates acts of manufacturing a semiconductor device according to various examples.
Figure 3A:
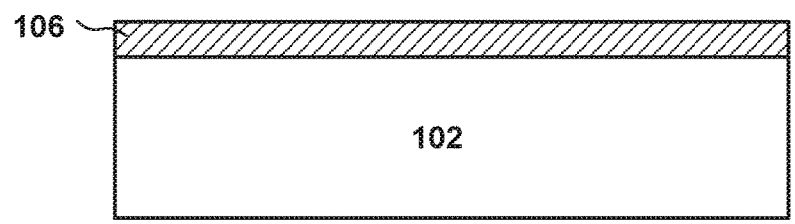
Figure 3A:
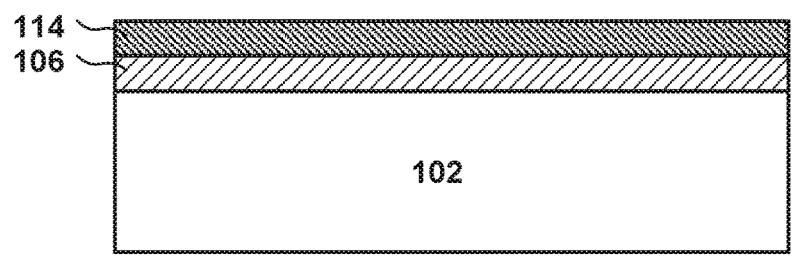
Figure 3B:
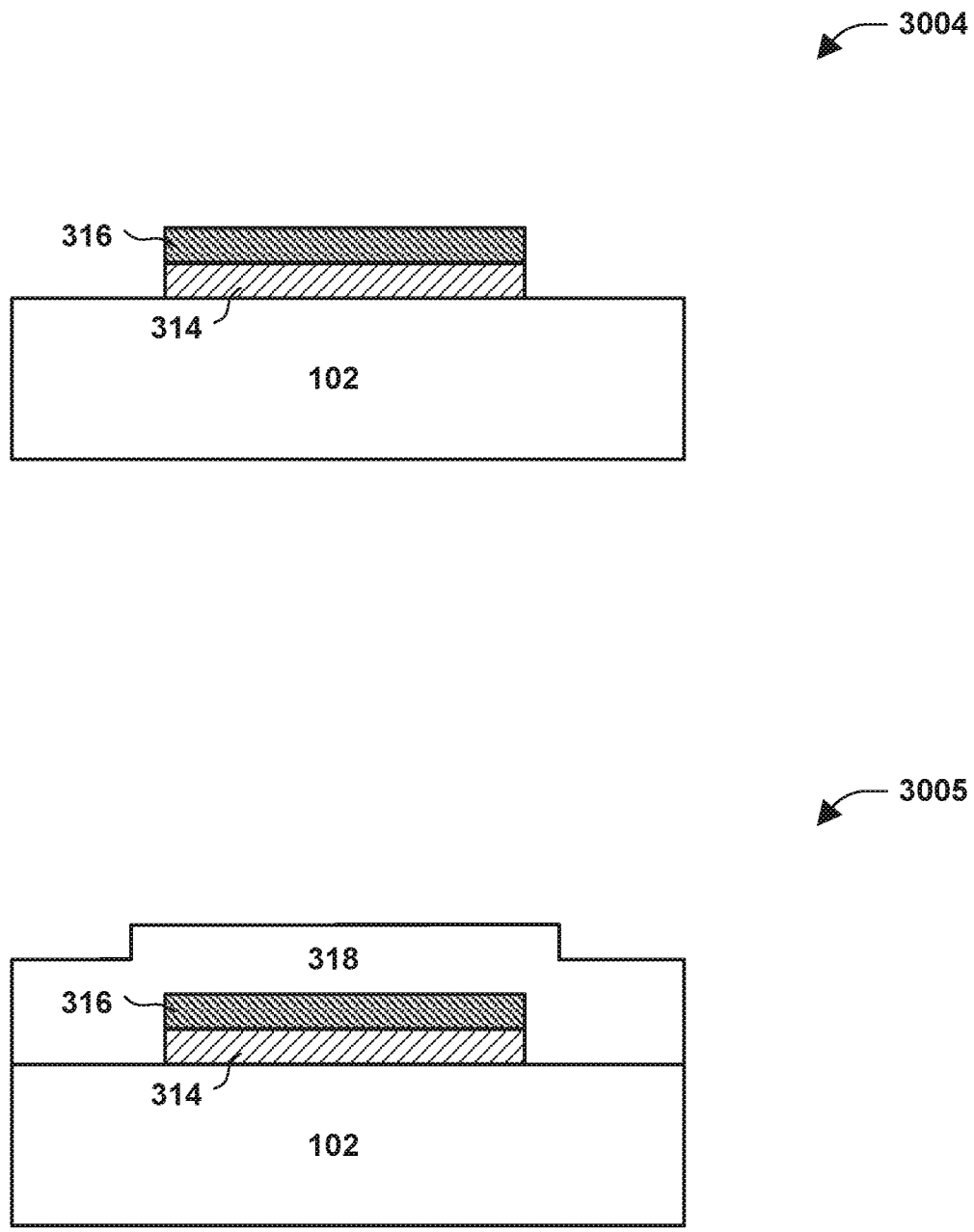
FIG. 3B schematically illustrates acts of manufacturing a semiconductor device according to various examples.
Figure 3C:
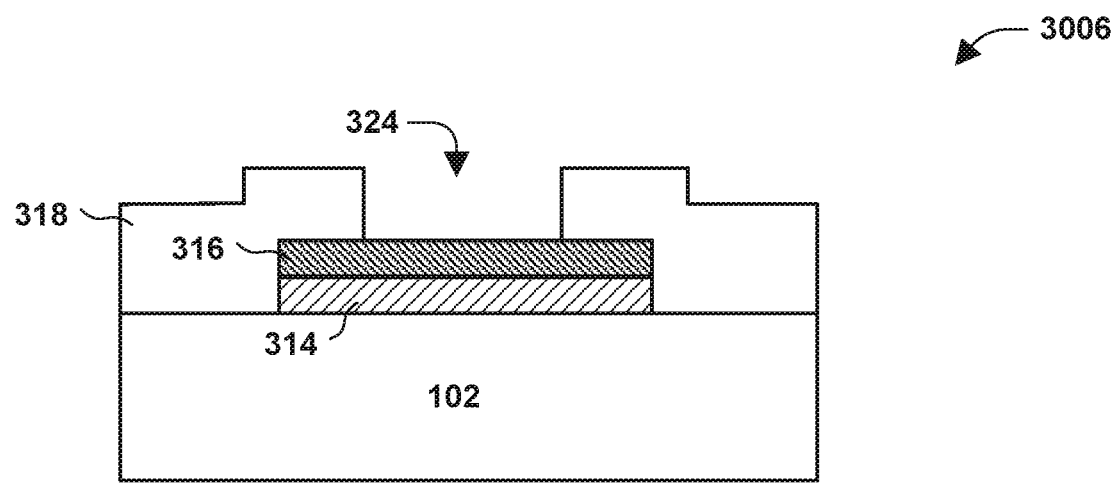
FIG. 3C schematically illustrates acts of manufacturing a semiconductor device according to various examples.
Figure 3C:
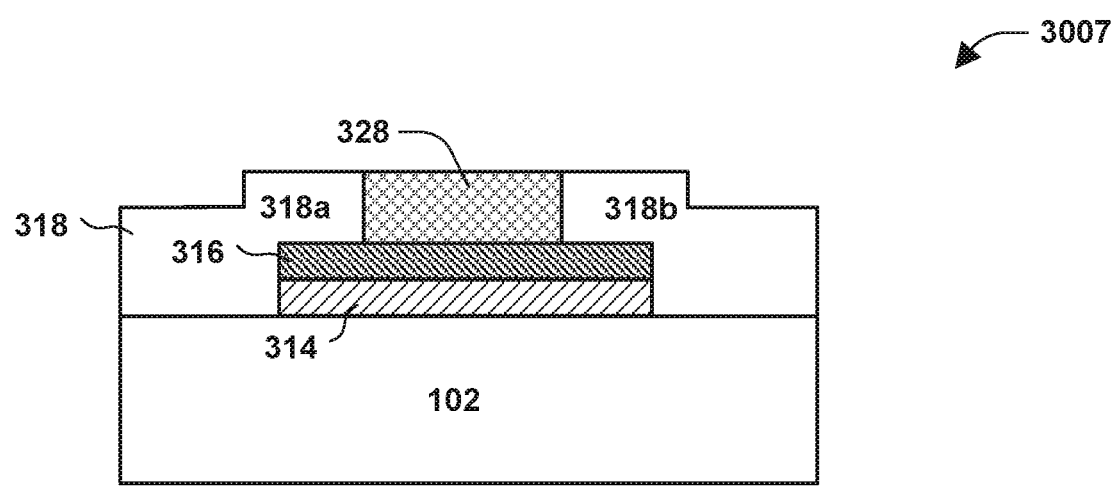
Figure 3D:
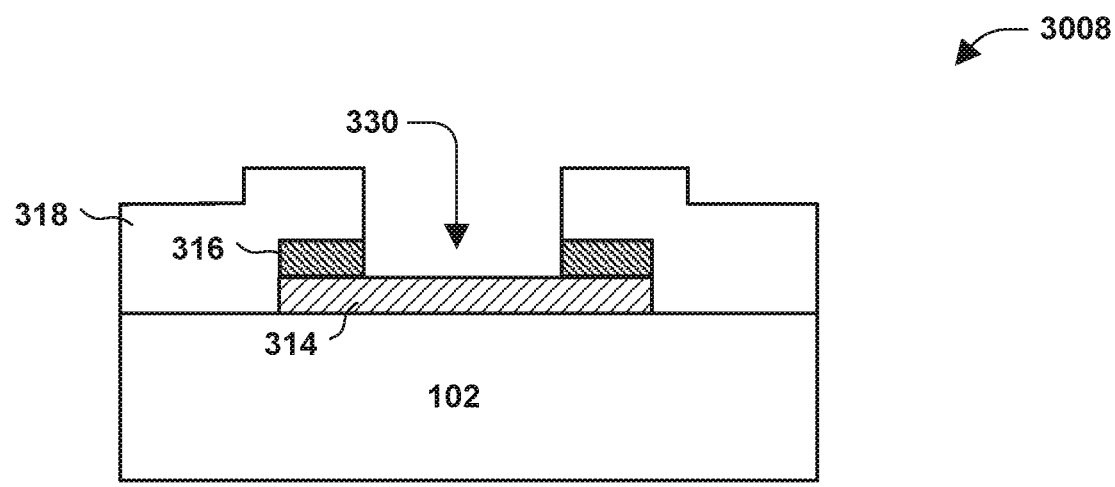
FIG. 3D schematically illustrates acts of manufacturing a semiconductor device according to various examples.
Figure 3D:
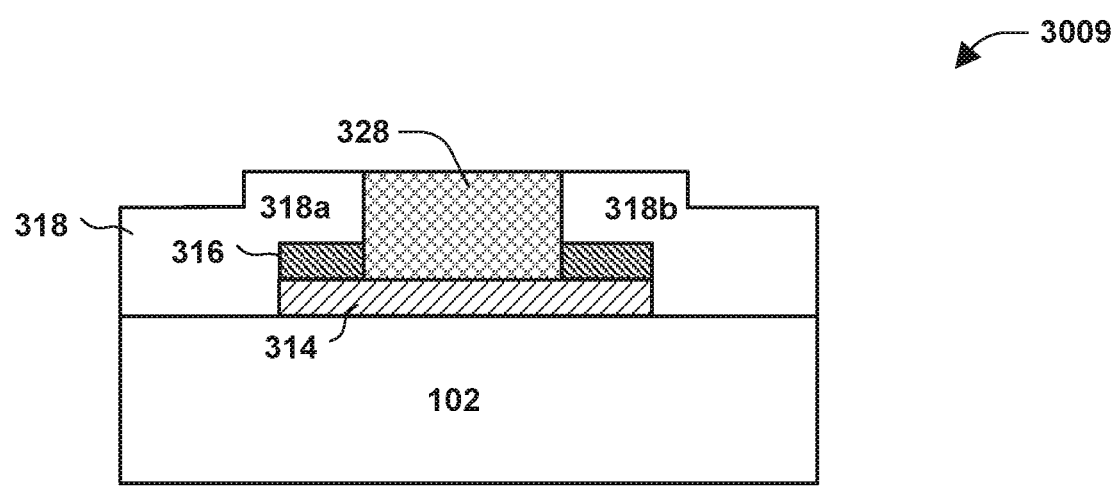

FIG. 2 illustrates aspects with respect to photopatterning the passivation layer 118 according to various examples of the present disclosure. A light source may direct light 202 to the passivation layer 118. A mask 204 may be positioned between the light source and the passivation layer 118 to define the pattern of light to which the passivation layer 118 is exposed. FIG. 2 illustrates an example in which the pattern of light illuminates one or more portions of the passivation layer 118 not to be removed by a developer. For example, the pattern of light may illuminate portions 118*d* and 118*f* of the passivation layer 118, and/or the pattern of light may not illuminate at least some of a portion 118*e* of the passivation layer 118. A developer may be applied to the passivation layer 118 to remove the portion 118*e* of the passivation layer 118 to form the opening 124.

In some examples, the passivation layer 118 has a first optical absorption coefficient at the i-line wavelength (e.g., 365 nm wavelength) or other wavelength. A polyimide has a second optical absorption coefficient at the i-line wavelength or the other wavelength. The first optical absorption may be less than the second optical absorption. For example, light corresponding to the i-line wavelength (or the other wavelength) may travel further into the passivation layer 118 before being absorbed, as compared to the polyimide. Accordingly, during exposure of the passivation layer 118 to the pattern of light, more light may pass through the passivation layer 118 and be reflected by a surface underlying the passivation layer 118, as compared to the polyimide. An amount of light reflected by the surface may be based upon a reflectivity of the surface. In an example, a first reflectivity of the anti-reflective layer 114 may be in the range of at least 10% to at most 30% (such as 20%). The first reflectivity of the anti-reflective layer 114 may be less than a second reflectivity of the structured metallic layer 110. Accordingly, by forming the anti-reflective layer 114 between the structured metallic layer 110 and the passivation layer 118, an amount of light reflected back into the passivation layer 118 during exposure of the passivation layer 118 to the pattern of light is reduced, as compared to a device without the anti-reflective layer 114.

The reduction in the amount of light reflected back into the passivation layer 118 during exposure of the passivation layer 118 to the pattern of light provides for an improved accuracy and/or precision with which the passivation layer 118 is structured and/or the opening 124 is formed (e.g., the opening 124 may be formed with higher resolution). For example, reflected light may illuminate one or more portions of the passivation layer 118, that may not directly be illuminated by the pattern of light to which the passivation layer 118 is exposed, and thus cause the one or more portions (e.g., residue) to remain in the semiconductor device after a development process (e.g., a process during which a developer is applied to remove soluble portions of the passivation layer 118 to form the opening 124). With respect to FIG. 2, if the anti-reflective layer 114 is not between the structured metal layer 110 and the passivation layer 118, at least some reflected light may illuminate one or more sections of the portion 118e of the passivation layer 118, and thus, at least some of the one or more sections of the portion 118e may not be removed during the development process. Thus, residue from the portion 118e may remain part of the passivation layer 118. However, by reducing the amount of light reflected back into the passivation layer 118 (by forming the anti-reflective layer 114 between the structured metallic layer 110 and the passivation layer 118), the amount of light reflected into the portion 118e is reduced, and thus, residue from the portion 118e that may remain after the development process is reduced. Accordingly, the anti-reflective layer 114 between the structured metallic layer 110 and the passivation layer 118 mitigates and/or inhibits residue remaining after the development process.

In some examples, by forming the anti-reflective layer 114 between the structured metallic layer 110 and the passivation layer 118 (and/or by reducing the amount of light reflected back into the passivation layer 118 during exposure of the passivation layer 118 to the pattern of light), a process window during which one or more processing acts and/or one or more transfer acts can be performed is extended. The one or more processing acts may comprise exposing the passivation layer 118 to the pattern of light, baking the passivation layer 118 in a second baking act, the development process, baking the passivation layer 118 in a third baking act and/or one or more other processing acts. In some examples, the second baking act may correspond to a post exposure bake of the passivation layer 118 (e.g., the post exposure bake may be performed after the passivation layer 118 is exposed to the pattern of light and/or before the development process is performed). The third baking act may correspond to a hard bake of the passivation layer 118 to harden the passivation layer 118 (e.g., the third baking act may be performed after the development process is performed to remove one or more portions of the passivation layer 118 to form the opening 124). The one or more transfer acts may comprise transferring the semiconductor device between one or more systems, tools and/or chambers with which the one or more processing acts are performed.

The extended process window may be a result of the reduction in the amount of light reflected back into the passivation layer 118 during exposure of the passivation layer 118 to the pattern of light. Alternatively and/or additionally, forming the anti-reflective layer 114 between the structured metallic layer 110 and the passivation layer 118 (and/or reducing the amount of light reflected back into the passivation layer 118 during exposure of the passivation layer 118 to the pattern of light) may enable use of one or more exposure doses (e.g., exposure doses within an optimal range of exposure doses) for exposure of the passivation layer 118 to the pattern of light. Use of the one or more exposure doses may not be enabled without the anti-reflective layer 114 between the structured metallic layer 110 and the passivation layer 118. For example, without the anti-reflective layer 114 between the structured metallic layer 110 and the passivation layer 118, using the one or more exposure doses may cause over exposure and/or under exposure (and/or may cause removal of more or less than a desired portion of the passivation layer 118 during development). In some examples, the extended process window may be a result of use of the one or more exposure doses for exposure of the passivation layer 118 to the pattern of light.

In an example, without the anti-reflective layer 114 between the structured metallic layer 110 and the passivation layer 118, a first process window during which the one or more processing acts and/or the one or more transfer acts can be performed is shorter than a second process window during which the one or more processing acts and/or the one or more transfer acts can be performed with the anti-reflective layer 114 between the structured metallic layer 110 and the passivation layer 118. In an example, the first process window without the anti-reflective layer 114 may be less than 2 hours (e.g., the first process window may be 1 hour) and/or the second process window with the anti-reflective layer 114 may be greater than 2 hours (e.g., the second process window may be 4 hours). Accordingly, by forming the anti-reflective layer 114 between the structured metallic layer 110 and the passivation layer 118, the one or more processing acts and/or the one or more transfer acts may be performed with less timing restrictions (e.g., in comparison with the first process window without the anti-reflective layer 114, the second process window with the anti-reflective layer 114 provides for more time to perform the one or more processing acts and/or the one or more transfer acts).

At 1007 (illustrated in FIG. 1C), a conductive structure 128 may be formed in the opening 124. In some examples, the conductive structure 128 may comprise one or more conductive materials (e.g., one or more metal materials) and/or one or more other materials. The conductive structure 128 may extend through the passivation layer 118. The conductive structure 128 may be between the portion 118d of the passivation layer 118 and the portion 118f of the passivation layer 118. In some examples, the conductive structure 128 may be electrically coupled to one or more components of the semiconductor device and/or the conductive structure 128 may be electrically coupled to external circuitry (e.g., a power source, a load of the semiconductor device, ground, a controller, etc.).

In some examples, the conductive structure 128 is electrically coupled to the structured metallic layer 110. For example, a portion of the anti-reflective layer 114, that is between the conductive structure 128 and the structured metallic layer 110, may electrically couple the conductive structure 128 to the structured metallic layer 110 (e.g., a conductivity of at least the portion of the anti-reflective layer 114 may provide for an electrical connection between the conductive structure 128 and the structured metallic layer 110). In some examples, the conductive structure 128 is in contact (e.g., direct contact) with the portion of the anti-reflective layer 114 that is between the conductive structure 128 and the structured metallic layer 110.

Alternatively and/or additionally, a portion of the anti-reflective layer 114 may be removed prior to forming the conductive structure 128. The portion may be removed via etching (e.g., electrochemical etching, plasma etching, wet etching and/or one or more other types of etching) and/or via one or more other removal techniques. For example, the portion that is removed may be vertically adjacent the opening 124. The conductive structure 128 may be in contact (e.g., direct contact) with the structured metallic layer 110 (e.g., the conductive structure 128 may be electrically coupled to the structured metallic layer 110 via the contact). In some examples, some residue from the anti-reflective layer 114 may remain on the structured metallic layer 110 after removing the portion of the anti-reflective layer 114 (e.g., there may be some residue from the anti-reflective layer 114 between the conductive structure 128 and the structured metallic layer 110).

For example, at 1008 (illustrated in FIG. 1D), the portion of the anti-reflective layer 114 may be removed prior to forming the conductive structure 128. Removing the portion of the anti-reflective layer 114 may form an opening 130 through the anti-reflective layer 114. In some examples, the opening 130 (extending through the anti-reflective layer 114) and the opening 124 (extending through the passivation layer 118) may be formed separately. For example, after forming the opening 124, the portion of the anti-reflective layer 114 may be removed to form the opening 130 underlying the opening 124. Alternatively and/or additionally, the opening 130 (extending through the anti-reflective layer 114) and the opening 124 (extending through the passivation layer 118) may be formed in a single removal process (e.g., at least one of a development process, an etching process, etc.). In some examples, the opening 130 may be formed in a different environment (e.g., a different chamber) than an environment (e.g., a chamber) in which the opening 124 is formed. Alternatively and/or additionally, the opening 130 may be formed in the same environment (e.g., the same chamber) as an environment in which the opening 124 is formed. In some examples, the opening 130 may be formed using different materials (e.g., different chemicals, different developer chemicals and/or different etching chemicals) than materials used to form the opening 124. Alternatively and/or additionally, the opening 130 may be formed using the same materials (e.g., the same chemicals, the same developer chemicals, and/or the same etching chemicals) as materials used to form the opening 124.

At 1009 (illustrated in FIG. 1D), the conductive structure 128 may be formed in the opening 124 and/or the opening 130. The conductive structure 128 may extend through the passivation layer 118 and/or the anti-reflective layer 114. In some examples, the conductive structure 128 is in contact (e.g., direct contact) with the structured metallic layer 110. In some examples, the conductive structure 128, the opening 124 (extending through the passivation layer 118) and/or the opening 130 (extending through the anti-reflective layer 114) are formed by performing a dual-damascene process.

FIGS. 3A-3D illustrate aspects with respect to manufacturing a semiconductor device according to various examples of the present disclosure. One or more acts of FIGS. 3A-3D generally correspond to one or more acts of FIGS. 1A-1C. For example, act 3001 of FIG. 3A may correspond to act 1001 of FIG. 1A. Act 3002 of FIG. 3A may correspond to act 1002 of FIG. 1A.

At 3003 (illustrated in FIG. 3A), the anti-reflective layer 114 is formed over the metallic layer 106 and/or the semiconductor substrate 102. The anti-reflective layer 114 may be an unstructured anti-reflective layer. The anti-reflective layer 114 may overlie the metallic layer 106 and/or the semiconductor substrate 102. Alternatively and/or additionally, the anti-reflective layer 114 may be vertically coincident with the metallic layer 106 and/or the semiconductor substrate 102.

At 3004 (illustrated in FIG. 3B), a structured metallic layer 314 is formed from the metallic layer 106 and/or a structured anti-reflective layer 316 is formed from the anti-reflective layer 114. In some examples, the metallic layer 106 is structured to form the structured metallic layer 314. The anti-reflective layer 114 is structured to form the structured anti-reflective layer 316. For example, one or more portions of the metallic layer 106 and/or one or more portions of the anti-reflective layer 114 may be removed to form the structured metallic layer 314 and/or the structured anti-reflective layer 316. The one or more portions of the metallic layer 106 and/or the one or more portions of the anti-reflective layer 114 may be removed via etching (e.g., electrochemical etching, plasma etching, wet etching and/or one or more other types of etching) and/or via one or more other removal techniques. In some examples, the anti-reflective layer 114 and/or the metallic layer 106 are structured such that one or more metallic structures of the structured metallic layer 314 are covered (e.g., completely covered or partially covered) by the structured anti-reflective layer 316.

At 3005 (illustrated in FIG. 3B), a passivation layer 318 is formed over the structured metallic layer 314, the structured anti-reflective layer 316 and/or the semiconductor substrate 102. It may be appreciated that the passivation layer 318 may correspond to the passivation layer 118, and may have one or more properties previously described with respect to passivation layer 118 and/or provide for one or more functions and/or benefits previously described with respect to passivation layer 118.

At 3006 (illustrated in FIG. 3C), an opening 324 is formed in the passivation layer 318. The opening 324 may overlie the structured anti-reflective layer 316. For example, the opening 324 may expose the structured anti-reflective layer 316. It may be appreciated that the opening 324 may be formed using one or more of the techniques described herein with respect to forming the opening 124. The structured anti-reflective layer 316 may provide for one or more of the functions and/or benefits for forming the opening 324 previously described with respect to the anti-reflective layer 114 for the forming the opening 124 (e.g., the structured anti-reflective layer 316 may provide for an extended process window for photopatterning the passivation layer 318 and/or the structured anti-reflective layer 316 may provide for an improved accuracy, precision and/or resolution with which the opening 324 is formed).

At 3007 (illustrated in FIG. 3C), a conductive structure 328 may be formed in the opening 324. In some examples, the conductive structure 328 may comprise one or more conductive materials (e.g., one or more metal materials) and/or one or more other materials. The conductive structure 328 may extend through the passivation layer 318. The conductive structure 328 may be between a portion 318a of the passivation layer 318 and a portion 318b of the passivation layer 318. In some examples, the conductive structure 328 may be electrically coupled to one or more components of the semiconductor device and/or the conductive structure 328 may be electrically coupled to external circuitry (e.g., a power source, a load of the semiconductor device, ground, a controller, etc.).

In some examples, the conductive structure 328 is electrically coupled to the structured metallic layer 314. For example, a portion of the structured anti-reflective layer 316, that is between the conductive structure 328 and the structured metallic layer 314, may electrically couple the conductive structure 328 to the structured metallic layer 314 (e.g., a conductivity of at least the portion of the structured anti-reflective layer 316 may provide for an electrical connection between the conductive structure 328 and the structured metallic layer 314). In some examples, the conductive structure 328 is in contact (e.g., direct contact) with the portion of the anti-reflective layer 316 that is between the conductive structure 328 and the structured metallic layer 314.

Alternatively and/or additionally, a portion of the structured anti-reflective layer 316 may be removed prior to forming the conductive structure 328. The portion may be removed via etching (e.g., electrochemical etching, plasma etching, wet etching and/or one or more other types of etching) and/or via one or more other removal techniques. For example, the portion that is removed may be vertically adjacent the opening 324. The conductive structure 328 may be in contact (e.g., direct contact) with the structured metallic layer 316 (e.g., the conductive structure 328 may be electrically coupled to the structured metallic layer 314 via the contact). In some examples, some residue from the structured anti-reflective layer 316 may remain on the structured metallic layer 314 after removing the portion of the structured anti-reflective layer 316 (e.g., there may be some residue from the anti-reflective layer 316 between the conductive structure 328 and the structured metallic layer 314).

For example, at 3008 (illustrated in FIG. 3D), the portion of the structured anti-reflective layer 316 may be removed prior to forming the conductive structure 328. Removing the portion of the structured anti-reflective layer 316 may form an opening 330 through the structured anti-reflective layer 316. In some examples, the opening 330 (extending through the structured anti-reflective layer 316) and the opening 324 (extending through the passivation layer 318) may be formed separately. For example, after forming the opening 324, the portion of the structured anti-reflective layer 316 may be removed to form the opening 330 underlying the opening 324. Alternatively and/or additionally, the opening 330 (extending through the structured anti-reflective layer 316) and the opening 324 (extending through the passivation layer 318) may be formed in a single removal process (e.g., at least one of a development process, an etching process, etc.). In some examples, the opening 330 may be formed in a different environment (e.g., a different chamber) than an environment (e.g., a chamber) in which the opening 324 is formed. Alternatively and/or additionally, the opening 330 may be formed in the same environment (e.g., the same chamber) as an environment in which the opening 324 is formed. In some examples, the opening 330 may be formed using different materials (e.g., different chemicals, different developer chemicals and/or different etching chemicals) than materials used to form the opening 324. Alternatively and/or additionally, the opening 330 may be formed using the same materials (e.g., the same chemicals, the same developer chemicals, and/or the same etching chemicals) as materials used to form the opening 324.

At 3009 (illustrated in FIG. 3D), the conductive structure 328 may be formed in the opening 324 and/or the opening 330. The conductive structure 328 may extend through the passivation layer 318 and/or the structured anti-reflective layer 316. In some examples, the conductive structure 328 is in contact (e.g., direct contact) with the structured metallic layer 314. In some examples, the conductive structure 328, the opening 324 (extending through the passivation layer 318) and/or the opening 330 (extending through the structured anti-reflective layer 316) are formed by performing a dual-damascene process.

Figure 4:
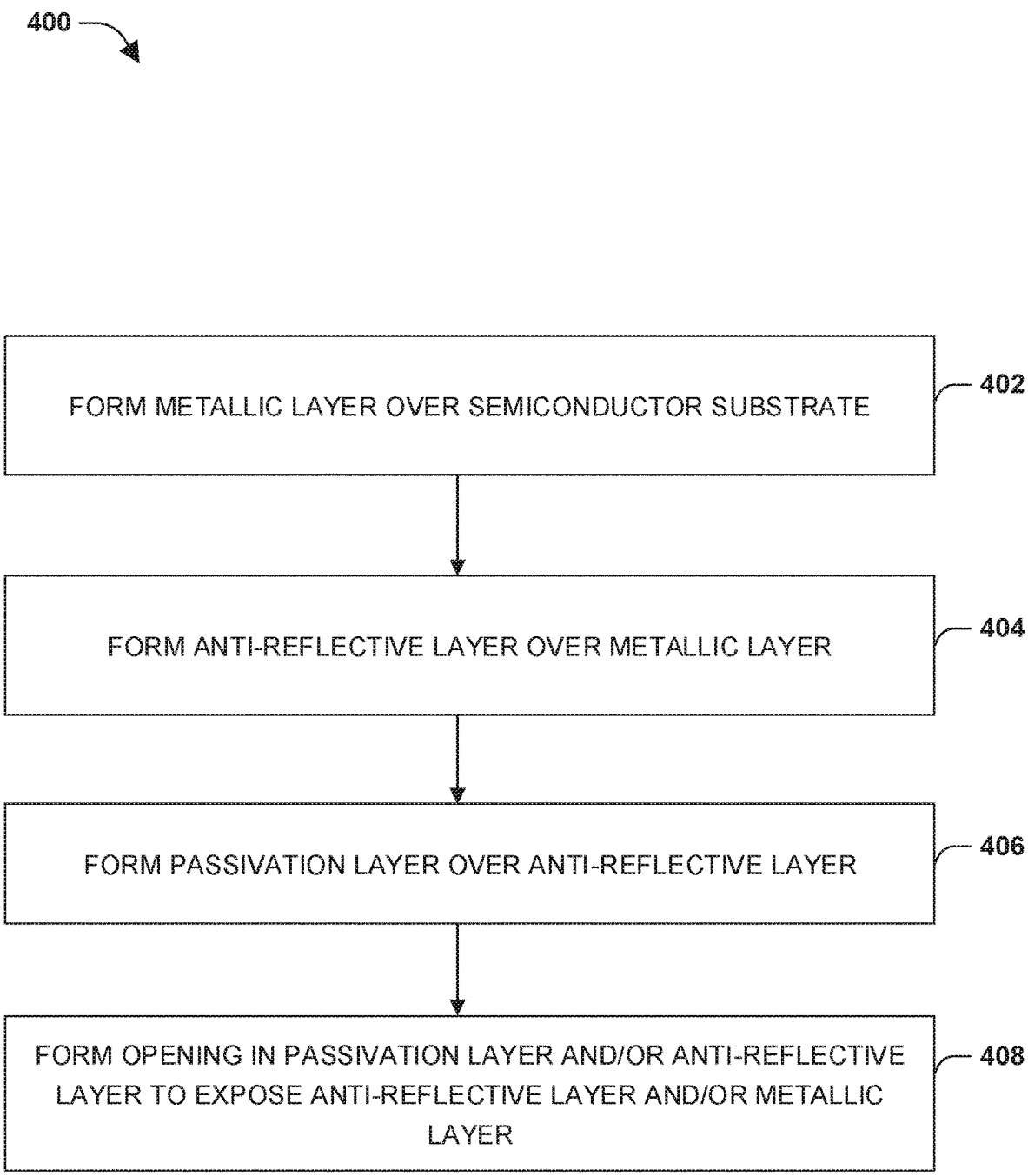
FIG. 4 is an illustration of an example method in accordance with the techniques presented herein.

FIG. 4 is an illustration of an example method 400 for manufacturing a semiconductor device. At 402, a metallic layer (e.g., the metallic layer 106 and/or the structured metallic layer 110) is formed over a semiconductor substrate (e.g., the semiconductor substrate 102). At 404, an anti-reflective layer (e.g., the anti-reflective layer 114 and/or the structured anti-reflective layer 316) is formed over the metallic layer. At 406, a passivation layer (e.g., the passivation layer 118 and/or the passivation layer 318) is formed over the anti-reflective layer. At 408, an opening (e.g., the opening 124, the opening 130, the opening 324 and/or the opening 330) is formed in the passivation layer and/or the anti-reflective layer to expose the anti-reflective layer and/or the metallic layer.

It may be appreciated that by applying one or more of the techniques described herein, such as by implementing the passivation layer and/or the anti-reflective layer in a semiconductor device, the semiconductor device may have improved protection from liquid, vapor and/or other contamination, thereby preventing damage to the semiconductor device and/or one or more surrounding components. Further, implementing the passivation layer and/or the anti-reflective layer in the semiconductor device may result in a reduction in manufacturing costs, for example, by extending a process window for performing one or more processing acts and/or transfer acts associated with structuring the passivation layer, and/or by reducing an amount of protection required by an apparatus (e.g., an inverter and/or other apparatus) comprising the semiconductor device. Further, implementing the passivation layer and/or the anti-reflective layer in the semiconductor device may result in an improvement to a quality of the semiconductor device, for example, by providing for an increase in accuracy, precision and/or resolution with which the passivation layer is structured.

According to some embodiments, a method for manufacturing a semiconductor device is provided. The method comprises forming a metallic layer over a semiconductor substrate; forming an anti-reflective layer over the metallic layer; forming a passivation layer over the anti-reflective layer; and forming an opening in the passivation layer to expose the anti-reflective layer.

According to some embodiments, forming the metallic layer comprises forming a structured metallic layer.

According to some embodiments, forming the metallic layer comprises forming an unstructured metallic layer.

According to some embodiments, the method comprises, after forming the anti-reflective layer and before forming the passivation layer, structuring the anti-reflective layer and the unstructured metallic layer.

According to some embodiments, forming the passivation layer comprises performing a spin-coating process.

According to some embodiments, the anti-reflective layer comprises an amorphous silicon material.

According to some embodiments, the passivation layer comprises a photopatternable inorganic-organic hybrid material.

According to some embodiments, the photopatternable inorganic-organic hybrid material comprises a photopatternable silicon material.

According to some embodiments, the photopatternable inorganic-organic hybrid material comprises a photopatternable organic modified ceramic material.

According to some embodiments, the method comprises forming a conductive structure in the opening.

According to some embodiments, a semiconductor device is provided. The semiconductor device comprises a metallic layer overlying a semiconductor substrate; an anti-reflective layer overlying the metallic layer; a passivation layer overlying the anti-reflective layer; and a conductive structure extending through the passivation layer.

According to some embodiments, a first optical absorption coefficient of the passivation layer is less than a second optical absorption coefficient of a polyimide.

According to some embodiments, the metallic layer is a structured metallic layer.

According to some embodiments, the anti-reflective layer is a structured anti-reflective layer.

According to some embodiments, the anti-reflective layer is an unstructured anti-reflective layer.

According to some embodiments, the anti-reflective layer comprises an amorphous silicon material.

According to some embodiments, the passivation layer comprises a spin-coatable material.

According to some embodiments, the passivation layer comprises a photopatternable inorganic-organic hybrid material.

According to some embodiments, the photopatternable inorganic-organic hybrid material comprises a photopatternable silicon material.

According to some embodiments, the photopatternable inorganic-organic hybrid material comprises a photopatternable organic modified ceramic material.

According to some embodiments, the conductive structure is electrically coupled to the metallic layer.

According to some embodiments, a semiconductor device is provided. The semiconductor device comprises a metallic layer overlying a semiconductor substrate; an anti-reflective layer overlying the metallic layer; and a passivation layer overlying the anti-reflective layer, wherein an opening in the passivation layer exposes the anti-reflective layer and/or the metallic layer.

It may be appreciated that combinations of one or more embodiments described herein, including combinations of embodiments described with respect to different figures, are contemplated herein.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

Any aspect or design described herein as an "example" is not necessarily to be construed as advantageous over other aspects or designs. Rather, use of the word "example" is intended to present one possible aspect and/or implementation that may pertain to the techniques presented herein. Such examples are not necessary for such techniques or intended to be limiting. Various embodiments of such techniques may include such an example, alone or in combination with other features, and/or may vary and/or omit the illustrated example.

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or more" unless specified otherwise or clear from context to be directed to a singular form. Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated example implementations of the disclosure. In addition, while a particular feature of the disclosure may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

While the subject matter has been described with reference to illustrative embodiments, this description is not intended to be construed in a limiting sense. Various modifications and combinations of the illustrative embodiments, as well as other embodiments of the present disclosure, will be apparent to persons skilled in the art upon reference to the description. It is therefore intended that the appended claims encompass any such modifications or embodiments.

What is claimed is:

1. A method of manufacturing a semiconductor device, comprising:
   forming a metallic layer over a semiconductor substrate;
   forming an anti-reflective layer over the metallic layer;

forming a passivation layer over the anti-reflective layer, wherein the passivation layer is in direct contact with the anti-reflective layer, wherein the passivation layer comprises a photopatternable material; and exposing the anti-reflective layer by forming an opening in the passivation layer in direct contact with the anti-reflective layer.

2. The method of claim 1, wherein:
the anti-reflective layer is in direct contact with the metallic layer.

3. The method of claim 1, wherein:
forming the metallic layer comprises forming an unstructured metallic layer.

4. The method of claim 3, comprising:
after forming the anti-reflective layer and before forming the passivation layer, structuring the anti-reflective layer and the unstructured metallic layer.

5. The method of claim 1, wherein:
the passivation layer is in direct contact with an anti-reflective portion that is not over the metallic layer.

6. The method of claim 1, wherein:
the anti-reflective layer comprises an amorphous silicon material.

7. The method of claim 1, wherein:
the photopatternable material comprises a photopatternable inorganic-organic hybrid material.

8. The method of claim 7, wherein:
the photopatternable inorganic-organic hybrid material comprises a photopatternable silicon material.

9. The method of claim 7, wherein:
the photopatternable inorganic-organic hybrid material comprises a photopatternable organic modified ceramic material.

10. The method of claim 1, wherein:
the passivation layer is in direct contact with the semiconductor substrate.

11. The method of claim 1, wherein:
the photopatternable material comprises a photopatternable silicone material.

12. A semiconductor device, comprising:
a metallic layer overlying and in direct contact with a semiconductor substrate;
an anti-reflective layer overlying the metallic layer;
a passivation layer overlying and in direct contact with the anti-reflective layer, wherein the passivation layer comprises a photopatternable material; and
a conductive structure extending through the passivation layer in direct contact with the anti-reflective layer.

13. The semiconductor device of claim 12, wherein:
the metallic layer is a structured metallic layer.

14. The semiconductor device of claim 13, wherein:
the anti-reflective layer is a structured anti-reflective layer.

15. The semiconductor device of claim 13, wherein:
the anti-reflective layer is an unstructured anti-reflective layer.

16. The semiconductor device of claim 12, wherein:
the anti-reflective layer comprises an amorphous silicon material.

17. The semiconductor device of claim 12, wherein:
the passivation layer comprises the spin-coatable material.

18. The semiconductor device of claim 12, wherein:
the photopatternable material comprises a photopatternable inorganic-organic hybrid material.

19. The semiconductor device of claim 12, wherein:
the conductive structure is electrically coupled to the metallic layer.

20. The semiconductor device of claim 12, wherein:
the photopatternable material comprises a photopatternable silicone material.

21. A semiconductor device, comprising:
a metallic layer overlying and in direct contact with a semiconductor substrate;
an anti-reflective layer overlying the metallic layer; and
a passivation layer overlying and in direct contact with the anti-reflective layer, wherein an opening in the passivation layer exposes at least one of the anti-reflective layer in direct contact with the anti-reflective layer or the metallic layer in direct contact with the semiconductor substrate.

22. A method of manufacturing a semiconductor device, comprising:
forming a metallic layer over a semiconductor substrate;
forming an anti-reflective layer over the metallic layer;
forming a passivation layer over the anti-reflective layer, wherein the passivation layer is in direct contact with the anti-reflective layer and at least one of the semiconductor substrate or an anti-reflective portion that is not over the metallic layer; and
exposing the anti-reflective layer by forming an opening in the passivation layer in direct contact with the anti-reflective layer.

23. The method of claim 22, wherein:
the passivation layer is in direct contact with the anti-reflective portion that is not over the metallic layer.

24. The method of claim 22, wherein:
the passivation layer is in direct contact with the semiconductor substrate.

* * * * *